US009806716B2

(12) United States Patent
Dey et al.

(10) Patent No.: US 9,806,716 B2
(45) Date of Patent: Oct. 31, 2017

(54) OUTPUT SIGNAL GENERATION CIRCUITRY FOR CONVERTING AN INPUT SIGNAL FROM A SOURCE VOLTAGE DOMAIN INTO AN OUTPUT SIGNAL FOR A DESTINATION VOLTAGE DOMAIN

(71) Applicant: ARM Limited, Cambridge (GB)

(72) Inventors: Ranabir Dey, Bangalore (IN); Vijaya Kumar Vinukonda, Bangalore (IN); Mikael Rien, Grenoble (FR)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/814,180

(22) Filed: Jul. 30, 2015

(65) Prior Publication Data
US 2016/0036441 A1   Feb. 4, 2016

(30) Foreign Application Priority Data

Jul. 30, 2014 (GB) .................................. 1413492.8

(51) Int. Cl.
*H03K 19/003* (2006.01)
*H03K 19/00* (2006.01)
(Continued)

(52) U.S. Cl.
CPC ... *H03K 19/00315* (2013.01); *H03K 3/35613* (2013.01); *H03K 3/356165* (2013.01);
(Continued)

(58) Field of Classification Search
CPC ......... H03K 19/0013; H03K 19/00315; H03K 19/00384; H03K 19/018521; H03K 3/35613; H03K 3/356165; H03K 3/356182
(Continued)

(56) References Cited

U.S. PATENT DOCUMENTS 6,084,430 A   7/2000   Wayner
6,147,540 A   11/2000   Coddington
(Continued)

FOREIGN PATENT DOCUMENTS

EP   2680441 A2   1/2014

OTHER PUBLICATIONS

UKIPO Search Report; GB 1413492.8; Jan. 13, 2015.
(Continued)

*Primary Examiner* — Alexander H Taningco
*Assistant Examiner* — Seokjin Kim
(74) *Attorney, Agent, or Firm* — Pramudji Law Group PLLC; Ari Pramudji

(57) ABSTRACT

Output signal generation circuitry 100 may be used for converting an input signal 110 from a source voltage domain to an output signal for a destination voltage domain, the destination voltage domain operating from a supply voltage that exceeds a stressing threshold of components within the output signal generation circuitry. The output signal generation circuitry may comprise level shifting circuitry 160 operating from the supply voltage, which is configured to generate at an output node 130 the output signal for the destination voltage domain in dependence on the input signal. The output signal generation circuitry may also comprise tracking circuitry 280A, 280B, 280C, 280D associated with at least one component of the level shifting circuitry to ensure that a voltage drop across the at least one component does not exceed the stressing threshold, wherein the tracking circuitry additionally introduces a delay in a change in the output signal in response to a change in the input signal. Timing compensation circuitry 180A, 180B may also be provided, to control the voltage on the output node in a manner to compensate for the delay introduced by the tracking circuitry.

20 Claims, 7 Drawing Sheets

(51) Int. Cl.
*H03K 19/0185* (2006.01)
*H03K 3/356* (2006.01)

(52) U.S. Cl.
CPC ... *H03K 3/356182* (2013.01); *H03K 19/0013* (2013.01); *H03K 19/00384* (2013.01); *H03K 19/018521* (2013.01)

(58) Field of Classification Search
USPC ........................................ 326/62–81; 327/333
See application file for complete search history.

(56) References Cited

U.S. PATENT DOCUMENTS

| | | |
|---|---|---|
| 6,346,829 B1 | 2/2002 | Coddington |
| 6,965,251 B1 | 11/2005 | Tran et al. |
| 7,173,472 B2 | 2/2007 | Chen et al. |
| 8,258,848 B2 | 9/2012 | Chen |
| 8,598,936 B2 | 12/2013 | Kuge |
| 2006/0255835 A1 | 11/2006 | Cordoba |
| 2010/0264976 A1 | 10/2010 | Duby et al. |
| 2011/0102383 A1 | 5/2011 | Cho |
| 2012/0133416 A1 | 5/2012 | Ogawa |
| 2014/0002146 A1* | 1/2014 | Kim ................ H03K 17/08104 327/109 |
| 2014/0097888 A1 | 4/2014 | Lee |
| 2016/0036445 A1 | 2/2016 | Dey et al. |
| 2017/0041002 A1 | 2/2017 | Dey et al. |

OTHER PUBLICATIONS

Lee, et al.; Wide-Range 5.0/3.3/1.8-V I/O Buffer Using 0.35-µm 3.3-V CMOS Technology; IEEE Transactions on Circuits and Systems I, Regular Papers; vol. 56, No. 4; Apr. 2009.

Chen, et la.; An Output Buffer for 3.3-V Applications in a 0.13-µm 1/2.5-V CMOS Process; IEEE Transactions on Circuits and Systems II, Express Briefs; vol. 54, No. 1; Jan. 2007.

Annema, et al.; 5.5-V I/O in a 2.5-V 0.25-µm CMOS Technology; IEEE Journal of Solid-State Circuits; vol. 36, No. 3; Mar. 2001.

UKIPO Search Report; GB 1413490.2; Jan. 14, 2015.

* cited by examiner

OUTPUT SIGNAL GENERATION CIRCUITRY FOR CONVERTING AN INPUT SIGNAL FROM A SOURCE VOLTAGE DOMAIN INTO AN OUTPUT SIGNAL FOR A DESTINATION VOLTAGE DOMAIN

CROSS-REFERENCE TO RELATED APPLICATIONS

This application claims priority to United Kingdom Patent Application No. GB 1413492.8, filed Jul. 30, 2014 which is titled OUTPUT SIGNAL GENERATION CIRCUITRY FOR CONVERTING AN INPUT SIGNAL FROM A SOURCE VOLTAGE DOMAIN INTO AN OUTPUT SIGNAL FOR A DESINATION VOLTAGE DOMAIN, the entire disclosure of which is herein incorporated by reference.

FIELD OF THE INVENTION

The present invention is concerned with output signal generation circuitry, particularly such circuitry that comprises level shifting circuitry.

BACKGROUND OF THE INVENTION

In a circuit, it is often necessary to convert a signal originating in one voltage domain into a form suitable for another voltage domain. For example, if the circuit contains different components that operate in different voltage domains then it may be necessary for part of the circuit that operates in one voltage domain to interact with another part of the circuit that operates in a second voltage domain. In order to achieve this, it is possible to use a "level shifter", which may take a signal in one voltage domain as an input and generate a corresponding signal in the second voltage domain as an output.

The voltage drop across any terminals of the components that make up the level shifter must be lower than a particular "technology limit value" (also referred to herein as a "native voltage" of those components) in order to prevent damage to the components due to overstress, which may in turn lead to reduced reliability. Consequently, it is difficult to generate a signal at a voltage that is higher than the technology limit value of the components that make up the level shifter. For example, if the level shifter is made up from CMOS components having a technology limit value of 1.8V, then it is difficult to generate a signal at a voltage of 3.3V.

A further consideration is that the level shifter may lie on the critical path of a circuit. Consequently, it is desirable for a level shifter to not introduce significant timing delays, which may cause the performance of the circuit to be adversely affected.

A problem to be solved over the prior art, therefore, is to provide an improved level shifter that takes these limitations into account.

SUMMARY OF THE INVENTION

In accordance with one aspect, there is provided output signal generation circuitry for converting an input signal from a source voltage domain to an output signal for a destination voltage domain, the destination voltage domain operating from a supply voltage that exceeds a stressing threshold of components within the output signal generation circuitry, the output signal generation circuitry comprising: level shifting circuitry operating from the supply voltage, configured to generate at an output node the output signal for the destination voltage domain in dependence on the input signal; tracking circuitry associated with at least one component of the level shifting circuitry to ensure that a voltage drop across the at least one component is less than or equal to (i.e. does not exceed) the stressing threshold, wherein the tracking circuitry additionally introduces a delay in a change in the output signal in response to a change in the input signal; and timing compensation circuitry configured to control the voltage on the output node in a manner to compensate for the delay introduced by the tracking circuitry.

The inventors of the present invention have realised that tracking circuitry can be used to help protect components from damage by preventing a voltage drop exceeding a stressing threshold from being applied across terminals of the components involved in the level shifting. The stressing threshold may, for example, correspond to the native voltage of the components. Accordingly, it is possible to provide output signal generation circuitry that converts an input signal from a source voltage domain to an output signal for a destination voltage domain using level shifting circuitry in which the supply voltage of the destination voltage domain exceeds the stressing threshold of components in the level shifting circuitry by including tracking circuitry in the output signal generation circuitry. The use of tracking circuitry on its own would, ordinarily, introduce a timing delay. Since the output signal generation circuitry may lie on the critical path, such a timing delay may not be acceptable. Accordingly, in order to counteract the timing delay introduced by the tracking circuitry, the inventors of the present invention have added compensation circuitry to the output signal generation circuitry. Overall, therefore, a level shift can be performed where the supply voltage of the destination voltage domain exceeds the stressing threshold of components in the level shifting circuitry, even if the level shifting circuitry lies on a critical path.

The at least one component of the tracking circuitry may take a number of forms. However, in one embodiment, the at least one component may comprise at least one transistor. In such an embodiment, for each such transistor, the tracking circuitry may comprise at least two additional transistors thereby forming a transistor stack with the associated transistor (for example, by placing the transistors in series). The tracking circuitry may therefore be configured such that as the voltage at a gate of the associated transistor varies, the voltage drop across the transistors within the transistor stack is less than or equal to the stressing threshold. However, as a result of the multiple transistors in each stack, a timing delay may be introduced between one end of the tracking circuitry and the other. For example, it may take a period of time for a change in the signal at one end of the tracking circuitry to produce a corresponding change in the signal at the other end of the tracking circuitry. By introducing the aforementioned timing compensation circuitry, such a delay can be counteracted or at least partly compensated for.

The output signal generation circuitry may comprise an intermediate node between two transistors of the tracking circuitry and the timing compensation circuitry may be configured to operate in dependence on the voltage of the intermediate node. The timing compensation circuitry may be able to compensate for the timing delay by considering the voltage at the intermediate node. Since the intermediate node is located between two transistors of the tracking circuitry, the timing compensation circuitry may not be subject to the full timing delay that would be experienced as a result of a current flowing through all the transistors of the tracking circuitry. Consequently, the timing compensation circuitry may be able to react after only a small delay has been experienced. In one example, the tracking circuitry may comprise first and second transistor stacks arranged in series between the supply voltage and a reference voltage and the intermediate node may be between the first and second transistor stacks. For example, the intermediate node may lie between a series of PMOS transistors (referred to later herein as a PGT circuit) and a series of NMOS transistors (referred to later herein as an NGT circuit) of the tracking circuitry.

In response to a transition of the input signal causing a voltage at the intermediate node to be driven to a predetermined local value, the timing compensation circuitry may be configured to drive the output node to a voltage indicative of the transition of the input signal. By considering the voltage change on the intermediate node, which may only be partly affected by the timing delay in the tracking circuitry, the timing compensation circuitry can help to drive the output node to a particular voltage, as determined by the transition of the input signal (e.g. logical high to logical low or vice-versa). Hence, the signal change at the output is only partly affected by the timing delay in the tracking circuitry.

The destination voltage domain may have multiple operating modes, each with an associated supply voltage, and at least one of the supply voltages may exceed the stressing threshold of components within the output signal generation circuitry. Additionally, for a current operating mode, the output signal generation circuitry may be configured to operate from the associated supply voltage of the destination voltage domain in that current operating mode. Consequently, the output signal generation circuitry can perform a level shift for a destination voltage domain where the supply voltage of that destination voltage domain is in excess of the stressing threshold of the components in the output signal generation circuitry.

One such operating mode may have an associated supply voltage that is equal to the stressing threshold of the components in the output signal generation circuitry. Bypass circuitry may be provided, which is in parallel with the tracking circuitry, so that the tracking circuitry can be bypassed if the supply voltage associated with the current operating mode is equal to the stressing threshold. If the voltage drop across the components of the output signal generation circuitry is equal to (or less) than the stressing threshold of those components, the risk of the components being overstressed is reduced. Consequently, there is no need for the tracking circuitry to be used, particularly since the tracking circuitry introduces a delay in the change in the output signal in response to a change in the input signal. The bypass circuitry therefore allows the tracking circuitry to be bypassed and so the delay caused by the tracking circuitry may be avoided. For example, for CMOS components with a stressing threshold (e.g. a native voltage) of 1.8V, the bypass circuitry may be configured to allow the tracking circuitry to be bypassed if the supply voltage is equal to 1.8V.

In one particular embodiment, the operating modes may include associated supply voltages of 1.8V, 2.5V, and/or 3.3V.

The level shifting circuitry may be configured to generate a first intermediate signal in a first internal voltage domain and a second intermediate signal in a second internal voltage domain, wherein the first internal voltage domain operates between the supply voltage of the destination voltage domain and a first reference voltage and wherein the second internal voltage domain operates between a supply voltage equal to the stressing threshold and a second reference voltage. For example, the first internal voltage domain may operate between the supply voltage of the destination voltage domain (DVDD) and a first reference voltage (REFP=DVDD−REFN) and the second internal voltage domain may operate between the supply voltage equal to the stressing threshold (REFN=DVDDLO) and the second reference voltage (GND).

There are a variety of different configurations in which the two intermediate signals may be used to generate a signal for the destination voltage domain. In one such configuration, a logical value of the first intermediate signal may be equal to a logical value of the second intermediate signal. The output signal generation circuitry may also comprise driver circuitry that comprises a PMOS driver coupled between the voltage supply of the destination voltage domain and the output node, controllable by the first intermediate signal; and an NMOS driver coupled between the output node and a reference voltage, controllable by the second intermediate signal. The level shifting circuitry may, for example, produce two different outputs that control the NMOS driver and the PMOS driver. Since the NMOS driver and PMOS driver are coupled between the voltage supply of the destination voltage domain and the reference voltage, and since the output node is between the NMOS driver and PMOS driver, it is possible to control a voltage of a signal at the output node by switching which of the PMOS and NMOS drivers are currently active, using the first and second intermediate signals, respectively.

The driver circuitry may comprise first output tracking circuitry associated with the PMOS driver and second output tracking circuitry associated with the NMOS driver.

The delay introduced by the tracking circuitry may cause a delay between a transition of the first intermediate signal and the second intermediate signal in response to a transition of the input signal. Furthermore, which of the first and second intermediate signals is delayed with respect to the other may be dependent on the direction of the transition of the input signal. For example, the delay introduced by the tracking circuitry may be such that only one of the PMOS and NMOS driver are enabled at any time. This is advantageous because if both the PMOS and NMOS driver are temporarily both enabled for a short period of time during the signal transition, and if the PMOS and NMOS driver are both connected between the supply of the destination voltage domain and the reference voltage (e.g. ground), then a current may freely flow from the supply of the destination voltage to the source of the reference voltage (e.g. to ground) during that period. This causes a potentially damaging spike in current and wastes power consumption. Accordingly, the delay caused by the tracking circuitry after being compensated for by the timing compensation circuitry may be such that only one of the NMOS and PMOS driver are active at any one time, thereby connecting the output node either to the reference voltage source (e.g. ground) or to the supply voltage source, respectively. Hence, the timing circuitry may be such that a large delay on the critical path is avoided while reducing unnecessary power consumption on the device by avoiding a situation where both the NMOS driver and PMOS driver are simultaneously enabled so as to provide a path between the destination voltage domain supply and the reference voltage supply (e.g. ground).

Although numerous different types of device may be used for the components of the output signal generation unit, in one embodiment, the components are Complementary Metal Oxide Semiconductor (CMOS) devices.

According to a second aspect, there is provided a method of using output signal generation circuitry to convert an input signal from a source voltage domain to an output signal for a destination voltage domain, the destination voltage domain operating from a supply voltage that exceeds a stressing threshold of components within the output signal generation circuitry, the method comprising the steps: generating, at an output node, the output signal for the destination voltage domain in dependence on the input signal; performing a tracking process to ensure that a voltage drop across components within the output signal generation circuitry is less than or equal to the stressing threshold of those components, wherein the tracking process additionally introduces a delay in a change in the output signal in response to a change in the input signal; and controlling the voltage on the output node in a manner to compensate for the delay introduced by the tracking step.

According to a third aspect, there is provided output signal generation circuitry configured to convert an input signal from a source voltage domain to an output signal for a destination voltage domain, the destination voltage domain operating from a supply voltage that exceeds a stressing threshold of components within the output signal generation circuitry, the output signal generation circuitry comprising: level shifting means for generating at an output node means the output signal for the destination voltage domain in dependence on the input signal, wherein the level shifting means operates from the supply voltage; tracking means associated with at least one component means of the level shifting circuitry for ensuring that a voltage drop across the at least one component means is less than or equal to the stressing threshold, wherein the tracking means additionally introduces a delay in a change in the output signal in response to a change in the input signal; and timing compensation means for controlling the voltage on the output node means in a manner to compensate for the delay introduced by the tracking means.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
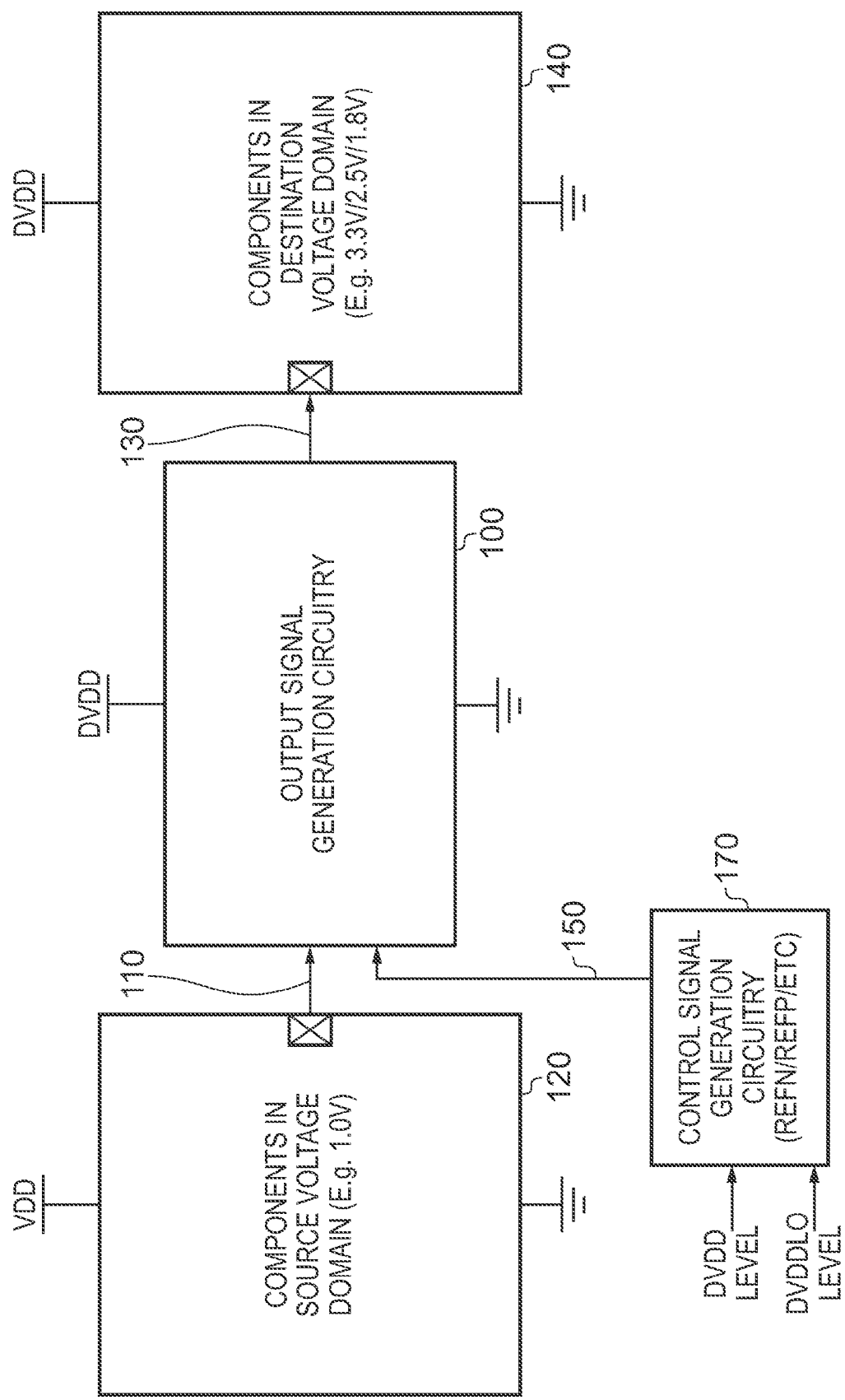
FIG. 1 shows the use of the output signal generation circuitry to convert a signal in one source voltage domain to a corresponding signal for a destination voltage domain in accordance with one embodiment.

FIG. 1 shows the use of output signal generation circuitry 100. The output signal generation circuitry 100 takes, as an input, a signal 110 from components in a source voltage domain 120. The components in the source voltage domain 120 may operate between a supply voltage (VDD) of, for example, 1.0V and ground. The output signal generation circuitry 100 may then generate an output signal 130 for components in a destination voltage domain 140. The components in the destination voltage domain 140 may operate between a different supply voltage (DVDD) and ground. For example, the components in the destination voltage domain 140 may operate with a supply voltage of 3.3V, 2.5V or 1.8V, depending on the operating mode of those components. In this example, the output signal generation circuitry 100 operates using the supply voltage of the destination voltage domain. In other words, the output signal generation circuitry 100 operates between a supply voltage DVDD and ground. The output signal generation circuitry 100 must therefore be capable of translating or converting a signal at VDD to DVDD. In the embodiment shown in FIG. 1 the output signal generation circuitry 100 is able to perform the conversion even if the voltage DVDD is greater than the stressing threshold (for the purposes of the embodiment description it will be assumed that the stressing threshold corresponds to the native voltage of the components) of the components within the output signal generation circuitry 100. For example, if DVDD is 3.3V then the output signal generation circuitry may be able to perform this conversion even if the components within the output signal generation circuitry 100 only have a native voltage of 1.8V. In addition to the signal 110 from the components in the source voltage domain 120, the output signal generation circuitry 100 also takes a control signal or signals 150 as an input (e.g. REFN/REFP). The purpose of these control signals will be discussed below. The control signals 150 are generated by control signal generation circuitry 170, with the control signals being generated dependent on the current DVDD level being used by the destination voltage domain and a specified DVDDLO value (in the embodiments described herein, DVDDLO being 1.8V). All of the components shown in the embodiment of FIG. 1 are connected to ground. However, it will be appreciated that in other embodiments, a different voltage may be used other than ground.

Figure 2:
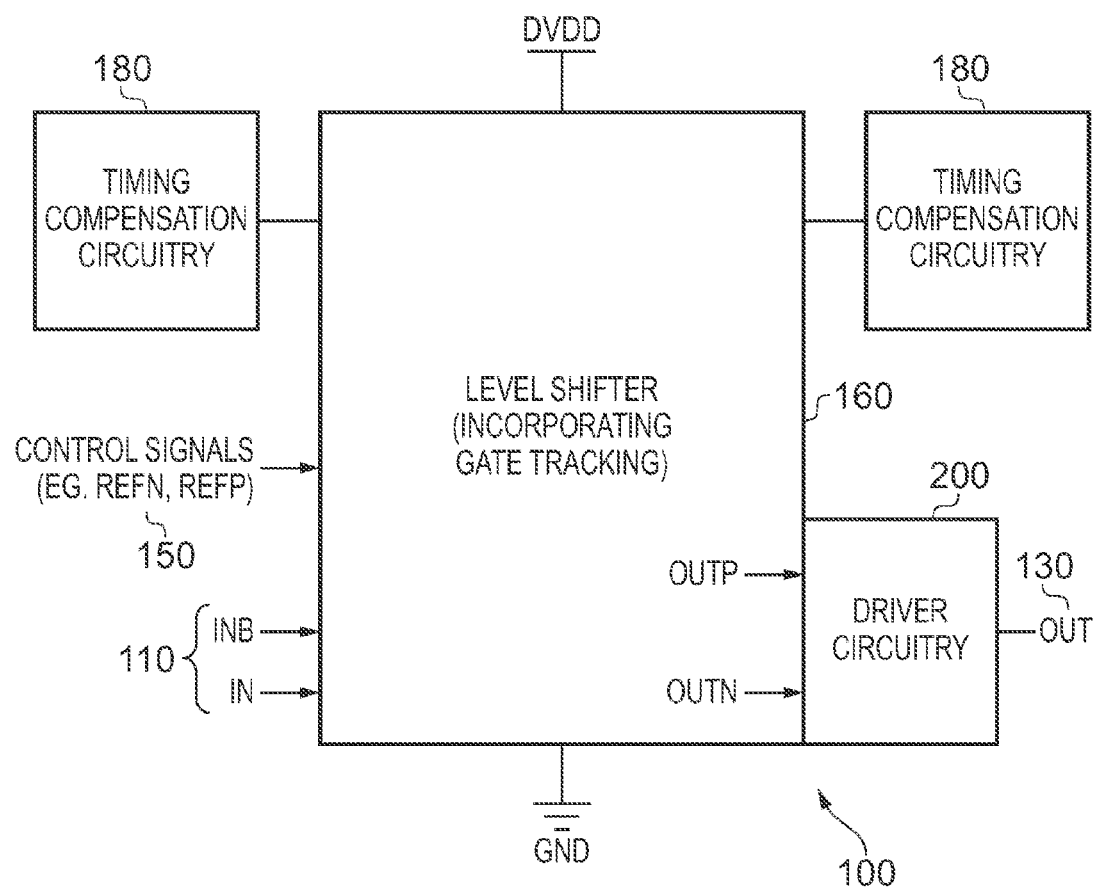
FIG. 2 shows the output signal generation circuitry in accordance with one embodiment.

FIG. 2 is a block based diagram showing the output signal generation circuitry in accordance with one embodiment. Said circuitry comprises a level shifter 160 that incorporates tracking circuitry. As previously discussed, the level shifter operates from the supply voltage (DVDD) of the destination voltage domain. The tracking circuitry is used to ensure that a voltage drop across the components within the level shifter do not exceed the native voltage of those components. The operation of the tracking circuitry will be discussed with reference to FIGS. 3A and 3B. The tracking circuitry also has the side effect of introducing a delay in a change in the output signal 130 in response to a change in the input signal 110. Timing compensation circuitry 180 compensates for this delay.

The level shifter 160 receives an input signal 110 made up from inputs IN, which corresponds to a particular value, and INB, which corresponds to the inverse of that value. The level shifter 160 converts the input signal 110 into a first intermediate signal (OUTP) and a second intermediate signal (OUTN) which are received by driver circuitry 200. The driver circuitry 200 takes the two intermediate signals as an input and produces the output signal 130.

Before discussing in detail the construction of the output signal generation circuitry, the earlier-mentioned tracking circuits will first be discussed with reference to FIGS. 3A and 3B. In particular, the tracking circuits employed are gate tracking circuits used in association with NMOS and PMOS transistors, the function of these gate tracking circuits being to ensure that, irrespective of the voltage logic level (0 or 1) applied to the gate of those NMOS or PMOS transistors, the voltage drop between the drain and source of those transistors does not exceed the native voltage, in this example it being assumed that the native voltage is 1.8V. Considering first FIG. 3A, an NMOS transistor 300 is provided for which the gate tracking functionality is required. This NMOS transistor 300 receives an input signal that can vary between 0 and 1.8V. However, it is coupled to a connection 330 whose voltage can vary between DVDD and 0V. Accordingly, a gate tracking circuit (denoted schematically by element 335 in the right hand side of FIG. 3A) is used to ensure that, irrespective of the voltage level at the connection 330, the voltage drop between the drain and source of the transistor 300 will not exceed the native voltage of that transistor, in this example 1.8V.

Figure 3A:
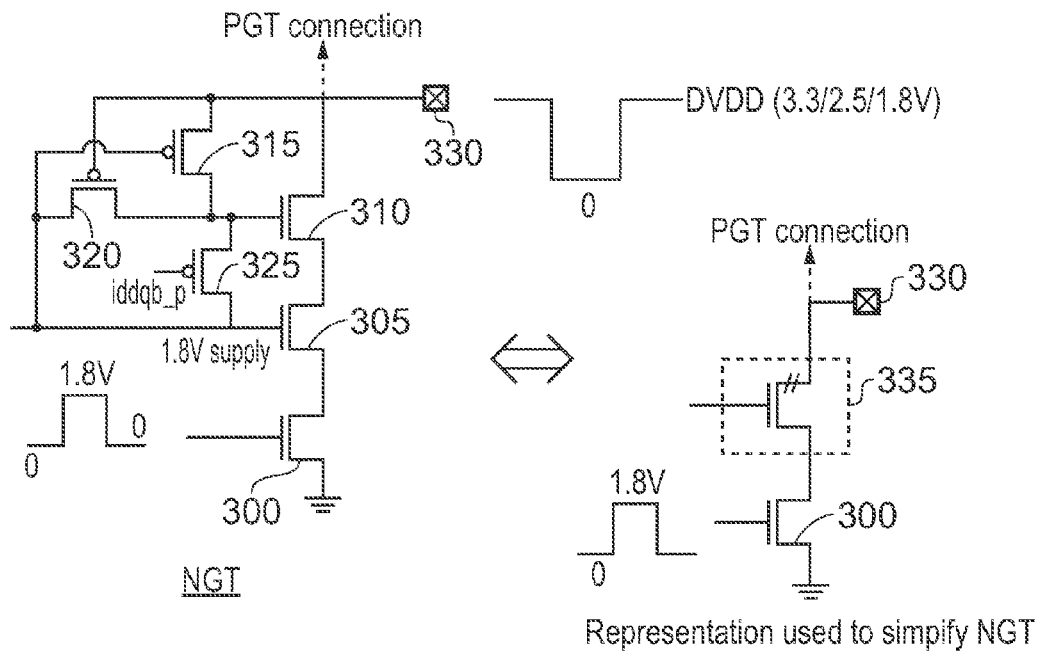
FIG. 3A shows an example of gate tracking circuitry for an NMOS transistor in accordance with one embodiment.

As shown in more detail in the left hand side of FIG. 3A, the gate tracking circuit 335 (also referred to herein as the NGT circuit) actually consists of a pair of NMOS transistors 305, 310 placed in series with the NMOS transistor 300 to form a transistor stack between the connection point 330 and the ground connection. In addition, a number of further transistors 315, 320, 325 are used to control the operation of the transistor 310 dependent on the voltage level at the connection 330.

When the input signal at the gate of the transistor 300 transitions to the logic high level (1.8V in this case), this turns on the transistor 300, and causes the connection point 330 to discharge to a logic zero level through the other transistors 305, 310. When the input signal to the gate of the transistor 300 returns to a logic zero level, other components within the system will cause the voltage at the connection point 330 to rise back to the DVDD voltage level. In one particular embodiment, it is often the case that the NGT circuit of FIG. 3A is coupled to the PGT circuit of FIG. 3B, and it is the operation of the PGT circuit that causes the connection 130 to transition back to the DVDD level in these circumstances.

When the DVDD voltage level is 1.8V, the control signal iddqb_p is set equal to zero, turning on the transistor 325, and causing the gates of both of the transistors 305, 310 to be turned on. This effectively bypasses the protection functionality of the NGT circuit, since when the DVDD level is 1.8V, there is no risk of overstressing the NMOS component 300. However, when the DVDD level is higher, for example 2.5V or 3.3V, the control signal iddqb_p is set to the DVDD level, turning off the transistor 325. In this instance, the voltage provided to the gate of the transistor 310 is then dependent on the operation of the transistors 315, 320. In particular, it will be appreciated that if the connection point 330 is at 3.3 or 2.5V this will cause the transistor 315 to turn on the and the transistor 320 to turn off. Conversely, if the connection point 330 is at a zero volt level, this will cause the transistor 320 to turn on and the transistor 315 to turn off. This will hence control the voltage drop across the individual transistors 300, 305, 310 in the transistor stack to ensure that no one transistor is exposed to a voltage drop that exceeds the native voltage of those transistors, irrespective of whether the connection point 330 is at the DVDD voltage level or the 0V level.

Figure 3B:
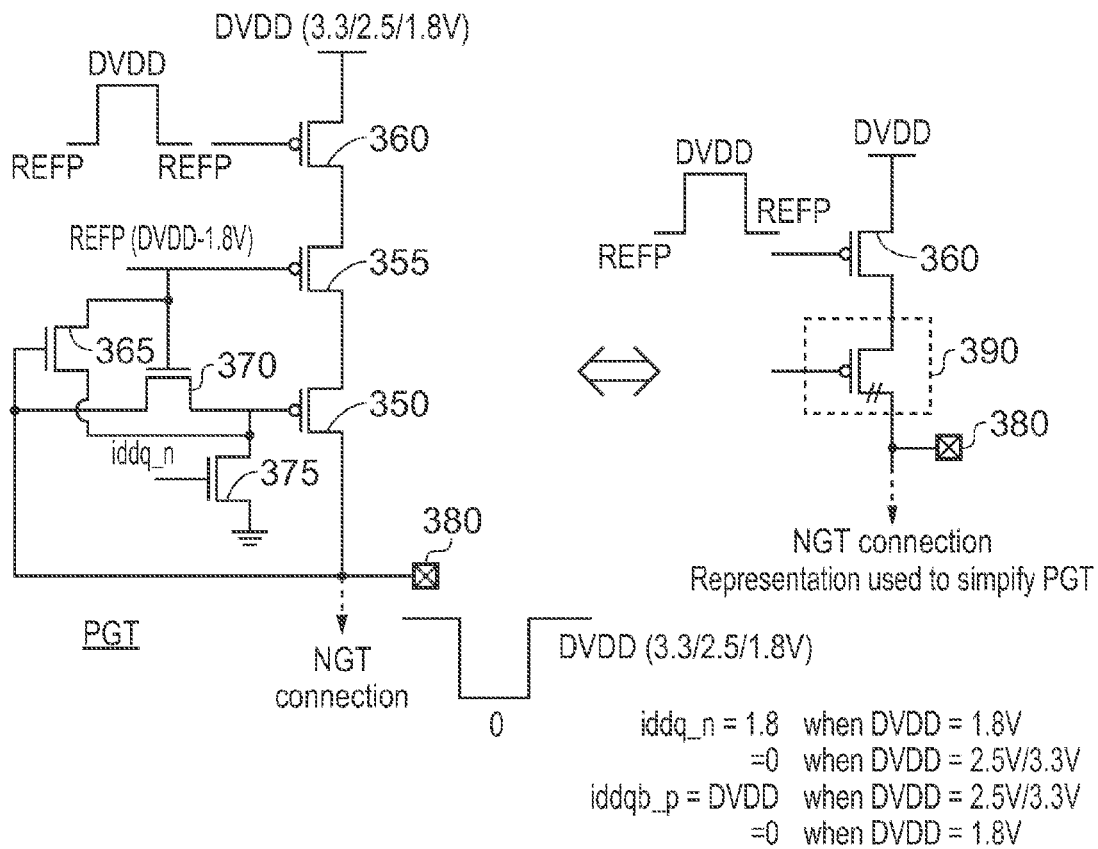
FIG. 3B shows an example of gate tracking circuitry for a PMOS transistor in accordance with one embodiment.

FIG. 3B shows the equivalent gate tracking circuitry 390 for the PMOS transistor 360. In this instance, the input signal to the PMOS transistor 360 varies between the REFP level and the DVDD level. The PGT gate tracking device 390 consists of an additional two PMOS transistors 350, 355 placed in series with the PMOS transistor 360 to form a transistor stack between the DVDD level and the connection point 380. In addition, transistors 365, 370 and 375 provide control functionality for the input to the gate of the transistor 350. When the DVDD voltage is set to 1.8V, the iddq_n signal is set to 1.8V, turning on the transistor 375 and providing a logic zero input to the gate of the PMOS transistor 350, turning that transistor on. In that instance, REFP will also be at a logic zero level, turning on the PMOS transistor 355, and accordingly the protection functionality of the PGT device will be bypassed in that situation, as it is not required. Otherwise, the transistor 375 will be turned off, and the gate voltages provided to the PMOS transistor 350 will depend on the operation of the PMOS transistors 365, 370. The NMOS transistors 365, 370 operate in essentially the same way as described earlier for the control transistors 315, 320 of the NGT device, with one of the NMOS transistors 365, 370 being turned on whilst the other is turned off, thus ensuring that at any point in time the voltage drop across any of the PMOS transistors 350, 355, 360 in the transistor stack does not exceed the native voltage of those transistors.

The gate tracking circuits described in FIGS. 3A and 3B are similar to those described in the article "5.5-V I/O in a 2.5-V 0.25-um CMOS Technology" by A J Annema et al, IEEE Journal of Solid State Circuits, 2001, which describes in general terms using gate tracking technology in association with transistors to improve lifetime of those components.

Figure 4:
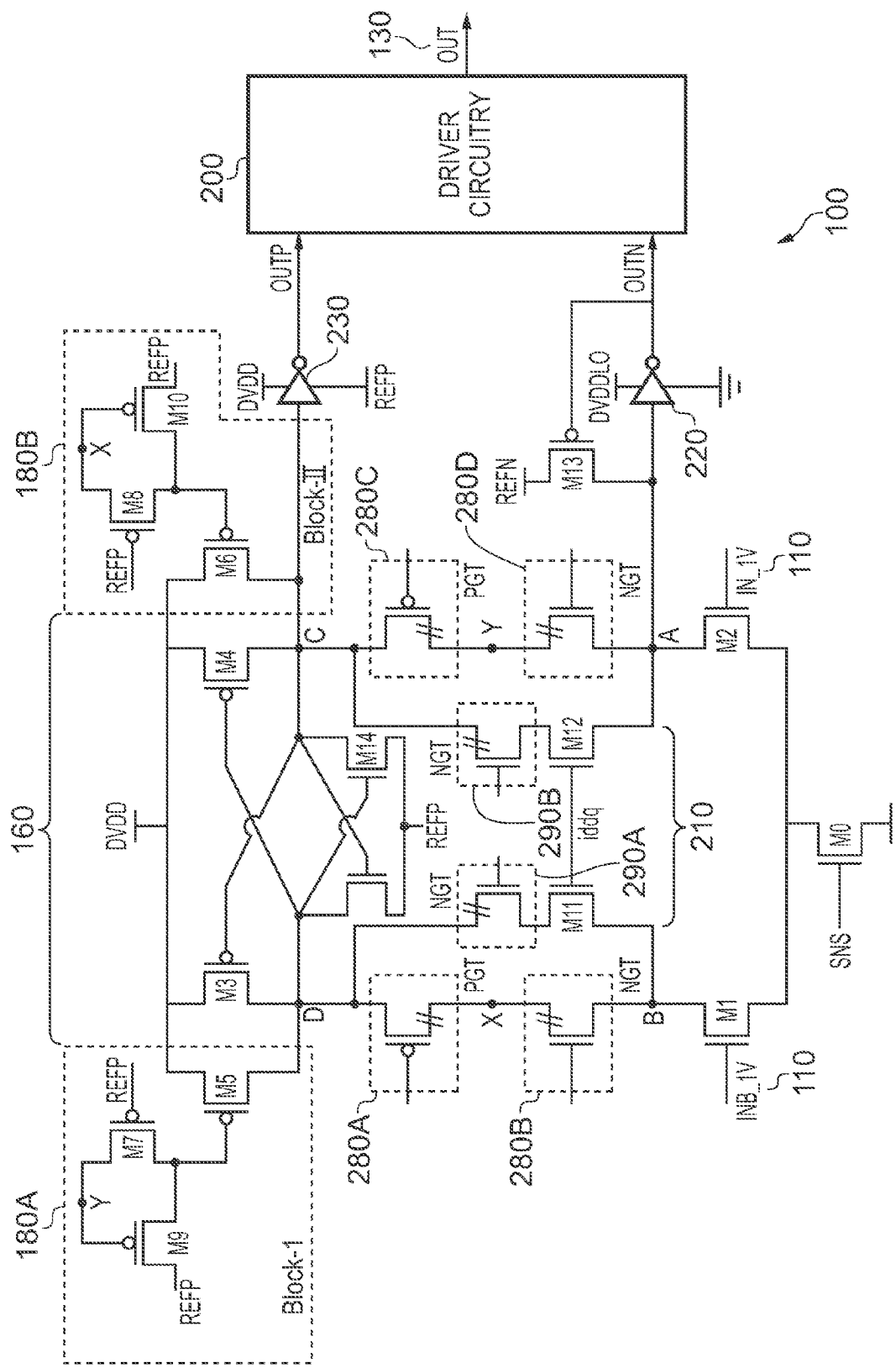
FIG. 4 shows a circuit level diagram for a part of the output signal generation circuitry in accordance with one embodiment.

FIG. 4 shows an example circuit diagram illustrating an example embodiment of the output signal generation circuitry 100. The circuitry 100 receives an input signal (IN_1V) and its complement (INB_1V) 110. This results in a pair of intermediate signals OUTP and OUTN being generated and delivered to the driver circuitry 200, which in turn produces the output signal 130. As shown in the figure, the first intermediate signal OUTP is in the voltage domain having a supply voltage of DVDD and a reference voltage of REFP. Similarly, the second intermediate signal OUTN is in the voltage domain having a source voltage of REFN (DVDDLO) and a reference voltage of ground.

The circuitry 100 comprises a number of tracking circuits 280A, 280B, 280C, 280D indicated as PGT (for PMOS based gate tracking circuits) and NGT (for NMOS based gate tracking circuits). The PMOS based gate tracking circuits receive a reference signal of REFP and the NMOS based gate tracking circuits receive a reference signal of REFN. The circuitry 100 further comprises timing compensation circuitry 180. In this embodiment, the tracking circuitry 180 is made up of two separate parts 180A, 180B. The embodiment shown in FIG. 4 also comprises bypass circuitry 210. The bypass circuitry comprises a transistor M11, a second transistor M12 and two corresponding NMOS based gate tracking circuits. The bypass circuitry is controlled via control signal iddq and may be used to bypass the gate tracking circuitry elsewhere in the circuitry 100 in the event that the supply voltage of the destination voltage domain is less than or equal to the native voltage of the components making up the level shifting circuitry 160. In other words, if there is no need to protect the components of the level shifter 160 from a voltage drop that is larger than the native voltage of those components, then the bypass circuitry makes it possible to bypass the gate tracking circuitry, therefore limiting the time delay caused by tracking circuitry.

Consider the example in which input signal 110 is high. Consequently, NMOS M2 is active. In this example, the control signal SNS may be considered to always be high, and therefore transistor M0 may be considered to always be active. Accordingly, the activation of NMOS M2 causes node A to drain towards ground. Node A therefore assumes a low state. This state is inverted by the inverter at 220, which therefore produces a value of DVDDLO (equivalent to logical high) at OUTN. This value is transmitted to the driver circuitry 200. Note however, that the use of transistor M0, together with the SNS signal is entirely optional. In an alternative embodiment, for example, M0 may be replaced with a direct connection to ground.

A short period of time after node A assumes a logical low value, the value of node Y will also fall towards logical low. The delay is caused by the NGT tracking circuit 280D between node A and node Y. Similarly, a short period of time after node Y drops to logical low, the value of node C will also drop to logical low. This second delay is due to the second gate tracking circuit 280C, which lies between node Y and node C. Under normal circumstances, it would therefore take a relatively long period of time for the value of node C to change in response to the value of IN_1V changing. In order to reduce the delay caused by this second gate tracking circuit 280C, timing compensation circuitry 180A is used.

As can be seen from the embodiment shown in FIG. 4, the logical value of node Y is also used to control transistor M9. In this example, node Y is at a logical low value and so transistor M9 is activated. Accordingly, the reference voltage REFP (which is equivalent to a logical low value) is made to flow to the gate of transistor M5, causing that transistor to be activated. M5 therefore connects DVDD to node D. Node D is connected to PMOS transistor M4, and consequently transistor M4 is deactivated, thereby disconnecting node C from DVDD. Further node D is connected to the transistor M14, causing NMOS transistor M14 to be activated.

Node C is therefore connected to REFP (which is equivalent to logical low) and so node C assumes a value of logical low. Note that this route from node Y does not involve the use of any gate tracking circuits. Consequently, timing compensation circuit 180 will cause node C to be driven to a logical low value more quickly than if node Y caused node C to assume a logical low value directly (i.e. via gate tracking circuitry 280C). Hence, the delay caused by PMOS based gate tracking circuit 280C between node Y and node C is compensated for by timing compensation circuit 180A. The logical low value at node C is inverted at inverter 230, thereby producing an OUTP value equal to DVDD (logical high). Hence, for an input value that is logical high, intermediate signals of DVDD and DVDDLO (both logical high) will be output for intermediate signals OUTP and OUTN respectively.

Returning to discussion of the timing compensation circuitry, in situations where node Y is at a logic high state, transistor M9 will turn off, but transistor M7 will turn on, turning off transistor M5, and disabling the above functionality.

It will be appreciated that in the alternative case, in which a logical low value is given as the input signal 110, transistor M2 will not be activated. However, by virtue of an inverted value being sent at input signal 110 via INB_1V, gate M1 will be activated. In such an example, the timing compensation circuit at 180B is used to produce the relative timing between the values of intermediate signals OUTP and OUTN via intermediate node X. In such an example, OUTP would acquire a value of REFP (corresponding to a logical low value) by node C being pulled towards DVDD by the timing compensation circuitry 180B, and OUTN would acquire a value of ground (also corresponding to a logical low value) a short time later. Hence, in these two examples, the logical value of OUTP and OUTN is the same.

Optional bypass circuitry 210 may be controlled by control signal iddq. In particular, the value of control signal iddq may be used to indicate whether the voltage of DVDD corresponds with the native voltage of the components in the level shifting circuitry 160. In this example, if DVDD is higher than the native voltage of the components in the level shifting circuitry 160, iddq may have a logical value of zero. Consequently, transistors M11 and M12 may be inactive and consequently bypass circuit 210 has no effect. Accordingly, the level shifting process must use the gate tracking circuitry and timing compensation circuitry in order to provide the level shift.

Alternatively, if the voltage of DVDD corresponds with or is lower than the native voltage of the components found in the level shifting circuitry 160, then iddq may have a logical value of one. This causes transistors M11 and M12 to be active. Consequently, only a single gate tracking circuit 290A, 290B must be passed through between nodes B and D or nodes A and C. Hence, the increased delay caused by using multiple gate tracking circuits (280A and 280B, or 280C and 280D) can be avoided, and the need for timing compensation circuitry 180 to be used can be mitigated. This is advantageous in situations in which it is desirable to reduce power consumption. In an alternative embodiment, the gate tracking circuits 290A and 290B in the tracking circuitry may be replaced by NMOS transistors having a 1.8V supply on their gates. This may be appropriate where iddq does not change frequently.

Figure 5:
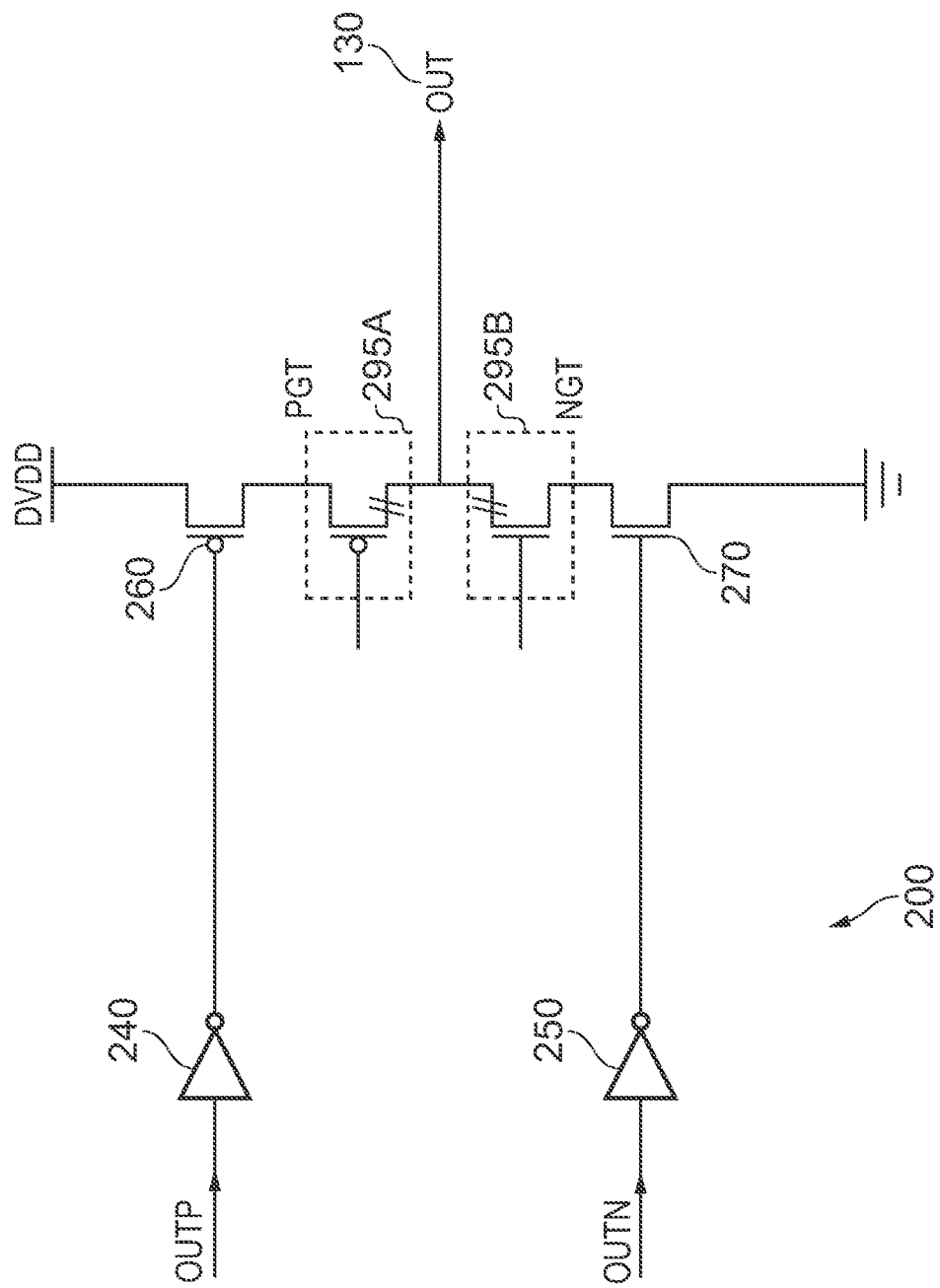
FIG. 5 shows a circuit level diagram of driver circuitry in accordance with one embodiment.

FIG. 5 shows an example of driver circuitry 200 in accordance with one embodiment. Here it can be seen how the intermediate signals (OUTP and OUTN) can be used to provide an output signal 130. The output signal 130 is in a destination voltage domain having a supply voltage DVDD and a reference voltage of ground.

The example of FIG. 5 continues the example started in FIG. 4 in which an input signal corresponding to logical high was provided and intermediate signals OUTP and OUTN were generated each having a logical high value. In the example of FIG. 5 then, after passing through inverters 240 and 250, the adjusted values of OUTP and OUTN will each be a logical low value. Accordingly, the NMOS transistor 270 will be deactivated and the PMOS transistor 260 will be activated. Hence, the output will be connected to DVDD and will be disconnected from ground causing the output signal to be equal to DVDD, which also corresponds to a logical high value. Conversely, if the input signal corresponds to a logical low value then, after passing through inverters 240 and 250, the adjusted values of OUTP and OUTN will each be a logical high value. Accordingly, the NMOS 270 will be activated and the PMOS 260 will be deactivated. Hence, the output will be connected to ground and will be disconnected from DVDD, causing the output to be a logical low value. Note that tracking circuitry 295A, 295B is used to protect PMOS transistor 260 and NMOS transistor 270 from a voltage drop in excess of the native voltage of those transistors (i.e. due to DVDD and ground).

As discussed with reference to FIG. 4, in the example of a logic low to logic high transition in the input signal, even with the timing compensation circuitry 180A, node A will drop to a logical low value before node C. In other words, the value of OUTN will transition before the value of OUTP. Consequently, the NMOS transistor 270 will deactivate prior to the PMOS 260 activating. In other words, whichever of the transistors PMOS 260 and NMOS 270 is active is deactivated before the other transistor is activated. This process is known as break-before-make and means that the NMOS 270 and PMOS 260 are not active simultaneously. This is advantageous since otherwise DVDD would be connected directly to ground for a brief period of time, which would cause a current spike and waste power consumption.

In the inverse situation in which PMOS 260 is already active and NMOS 270 is inactive, and a logic high to logic low transition occurs in the input signal, node C will transition to a logic high state before node A. Consequently, OUTP will transition before OUTN and hence PMOS transistor 260 will switch and deactivate (disconnecting DVDD from the output) before NMOS transistor 270 switches and activates (connecting the output to ground). Again, in other words, the active transistor (PMOS 260) is switched off before the other transistor (NMOS 270) is activated. Hence, NMOS 270 and PMOS 260 are not active simultaneously and the power supply DVDD is not connected directly to ground, which would cause a current spike and waste power.

Figure 6:
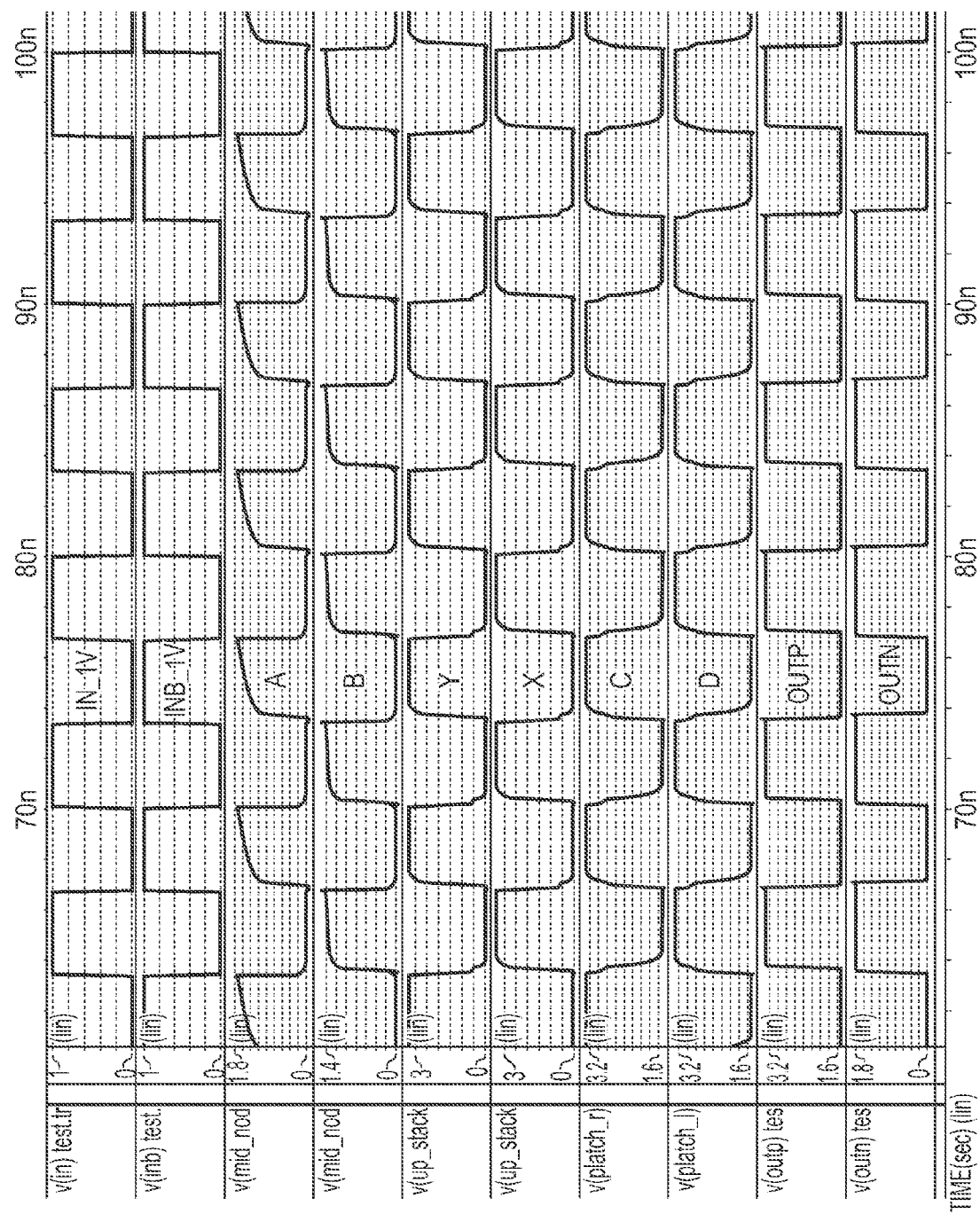
FIG. 6 shows a timing diagram for the circuit diagram of FIG. 4 in accordance with one embodiment.

This break-before-make behaviour and other timing characteristics of the transistors can be seen with reference to FIG. 6.

A first observation is that the logical values of OUTP and OUTN are the same. Consequently, only one of the PMOS 260 and NMOS 270 are active at a time and so the value of the output signal 130 either corresponds to, in the example of FIG. 5, a logical high value of DVDD or a logical low value corresponding to ground.

A further observation is that when the input signal 110 transitions from a value of logical high to logical low (for example at 80 nanoseconds), node A transitions from zero to one much more slowly than node C transitions from zero to one. This can also be seen in that OUTP transitions slightly before OUTN. Consequently, PMOS 260 will deactivate before NMOS 270 activates, thereby avoiding the earlier mentioned current spike. In the reverse situation (for example as shown at 90 nanoseconds) node A transitions extremely quickly whilst node C transitions more slowly. This is also shown by the fact that the transition of OUTN occurs slightly before the transition of OUTP. Hence, NMOS 270 is deactivated slightly before PMOS 260 is activated. In other words, as demonstrated with reference to FIG. 5, the active one of PMOS 260 and NMOS 270 is deactivated before the other transistor is activated. Consequently, PMOS 260 and NMOS 270 are not active simultaneously and hence DVDD is not connected straight to ground.

Figure 7:
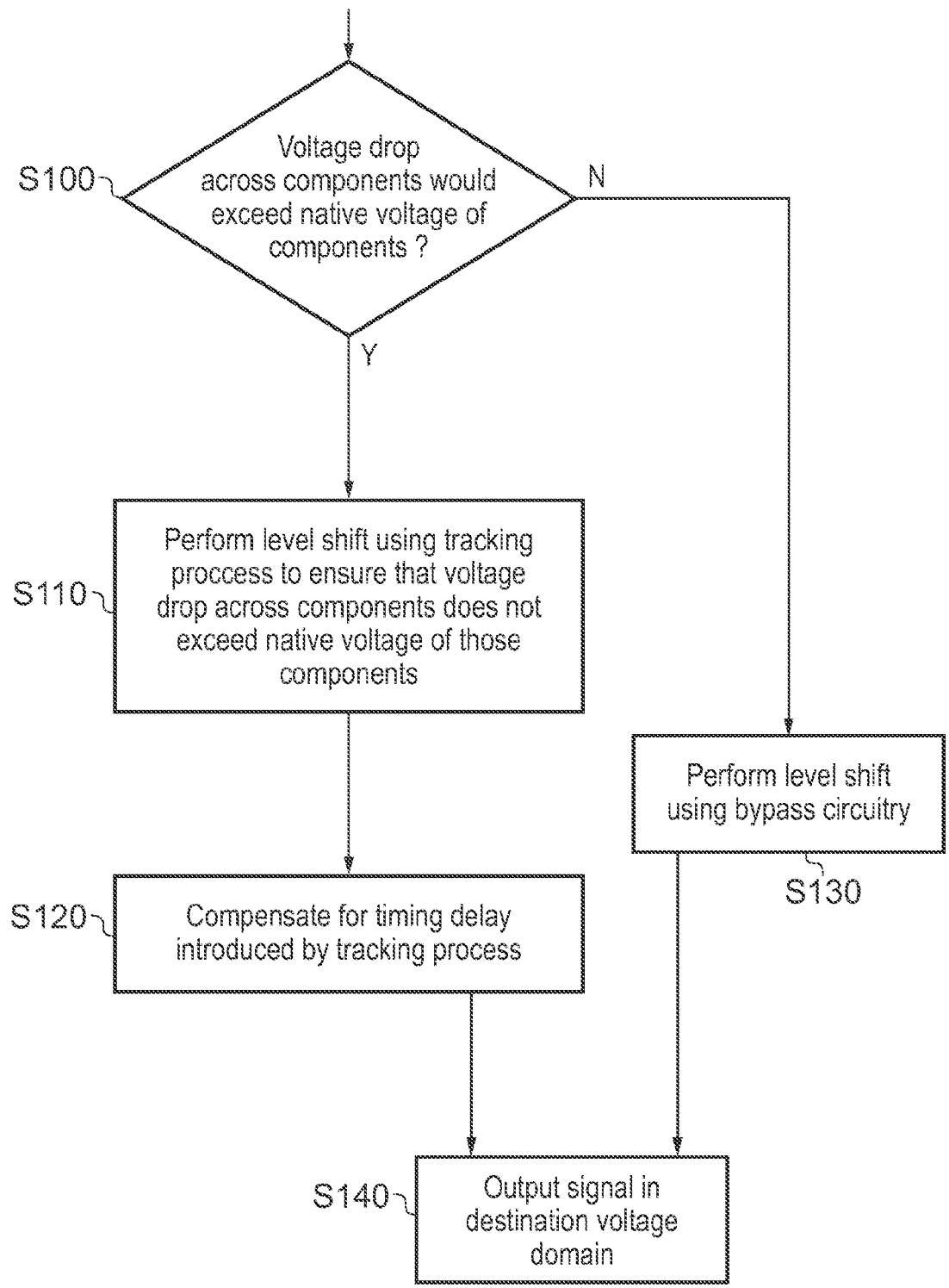
FIG. 7 shows, in flowchart form, a method of operating output signal generation circuitry in accordance with one embodiment.

FIG. 7 is a flowchart that illustrates a method of operating output signal generation circuitry. In the embodiment shown in FIG. 7, the flow begins at step S100 where it is determined whether or not a potential voltage drop across the components of the level shifter, as a result of performing the level shift, would exceed the native voltage of those components. For example, if the native voltage of the components in the level shifting circuitry is 1.8V then such a situation could arise if the destination voltage domain was 3.3V, since this could result in a potential voltage drop of 3.3V across one or more components.

If such a potential voltage drop is detected based on the supply voltage of the destination voltage domain, the flow continues to step S110 where the level shifting is performing using a gate tracking process. This may be performed, for example, using the gate tracking circuitry as previously illustrated in FIGS. 3A and 3B. As a consequence of using the gate tracking circuitry, a delay in the change in output signal in response to a change in the input signal may be produced. To compensate for this delay, at step S120, compensation for the delay is carried out. This may occur, for example, by using the timing compensation circuitry 180 illustrated in FIG. 2, for example. Finally, the output signal is output in the destination voltage domain at step S140.

If, however, at step S100 it is determined that the voltage drop across the components in the level shifting circuitry would not exceed the native voltage of those components, then flow may proceed to step S130 where level shifting is performed without using a tracking process. For example, the level shifting may be performed using bypass circuitry 210 as shown in FIG. 4. In this example, since the tracking process is not used, there is also no need to perform a time compensation process and consequently, the output signal can be produced in the destination voltage domain at step S140.

Note that steps S130 and S100 are optional. If the voltage drop across components of the level shifter is less than or equal to the native voltage of those components, the level shifting can still be performed using, for example, tracking circuitry and time compensation circuitry. The difference is that in providing the bypass circuitry to allow the gate tracking circuitry to be bypassed where it is not strictly necessary, the energy expended as a result of performing the level shift can be reduced as a consequence of using less circuitry.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. An apparatus for converting an input signal from a source voltage domain to an output signal for a destination voltage domain, comprising:
   level shifting circuitry operating from a supply voltage, wherein the level shifting circuitry generates, at an output node, the output signal for the destination voltage domain in dependence on the input signal;
   tracking circuitry associated with the level shifting circuitry, wherein the tracking circuitry includes a first gate tracking circuit of a first type and a second gate tracking circuit of a second type that is different than the first type,
      the first gate tracking circuit having first transistors of the first type arranged in series between the input signal and the second gate tracking circuit, wherein the first transistors of the first type include a pair of first transistors that form a first transistor stack with at least one other first transistor,
      the second gate tracking circuit having second transistors of the second type arranged in series between the supply voltage and the first gate tracking circuit, wherein the second transistors of the second type include a pair of second transistors that form a second transistor stack with at least one other second transistor, and
   wherein the tracking circuitry ensures that a voltage drop across the first and second transistors is less than or equal to a stressing threshold; and timing compensation circuitry that controls a voltage on the output node to compensate for a delay introduced by the tracking circuitry.

2. The apparatus of claim 1, wherein the delay is associated with a change in the output signal in response to a change in the input signal.

3. The apparatus of claim 1, wherein the tracking circuitry is configured such that as the voltage at a gate of the at least one transistor varies, the voltage drop across the transistors within the transistor stack is less than or equal to the stressing threshold.

4. The apparatus of claim 1, further comprising an intermediate node between the first and second gate tracking circuits of the tracking circuitry, and wherein the timing compensation circuitry is configured to operate in dependence on the voltage of the intermediate node.

5. The apparatus of claim 4, wherein the first and second gate tracking circuits are arranged in series between the supply voltage and the input voltage.

6. The apparatus of claim 4, wherein in response to a transition of the input signal causing a voltage at the intermediate node to be driven to a predetermined logical value, the timing compensation circuitry is configured to drive the output node to a voltage indicative of the transition of the input signal.

7. The apparatus of claim 1, wherein the destination voltage domain has multiple operating modes associated with multiple supply voltages that includes the supply voltage,
wherein each of the operating modes is associated with a particular supply voltage of the multiple supply voltages,
wherein at least one of the multiple supply voltages exceeds the stressing threshold, and
wherein for a particular operating mode, the apparatus is configured to operate from one of the multiple supply voltages associated with the destination voltage domain operating in the particular operating mode.

8. The apparatus of claim 7, wherein at least one of the multiple supply voltages associated with one of the multiple operating modes is equal to the stressing threshold.

9. The apparatus of claim 7, further comprising:
bypass circuitry in parallel with the tracking circuitry and configured to allow the tracking circuitry to be bypassed if a supply voltage associated with the particular operating mode is equal to the stressing threshold.

10. The apparatus of claim 9, wherein the bypass circuitry is configured to allow the tracking circuitry to be bypassed if the supply voltage associated with the particular operating mode is equal to 1.8V.

11. The apparatus of claim 7, wherein the multiple operating modes include associated supply voltages at 1.8V, 2.5V, and 3.3V.

12. The apparatus of claim 1, wherein the level shifting circuitry is further configured to:
generate a first intermediate signal in a first internal voltage domain; and
generate a second intermediate signal in a second internal voltage domain,
wherein the first internal voltage domain operates between the supply voltage of the destination voltage domain and a first reference voltage, and
wherein the second internal voltage domain operates between a supply voltage equal to the stressing threshold and a second reference voltage.

13. The apparatus of claim 12, wherein a logical value of the first intermediate signal is equal to a logical value of the second intermediate signal.

14. The apparatus of claim 12, further comprising driver circuitry, wherein the driver circuitry comprises:
a PMOS driver coupled between the supply voltage of the destination voltage domain and the output node, wherein the PMOS driver is controllable by the first intermediate signal; and
an NMOS driver coupled between the output node and a reference voltage, wherein the NMOS driver is controllable by the second intermediate signal.

15. The apparatus of claim 14, wherein the driver circuitry further comprises:
first output tracking circuitry associated with the PMOS driver; and
second output tracking circuitry associated with the NMOS driver.

16. The apparatus of claim 12, wherein the delay introduced by the tracking circuitry causes a delay between a transition of the first intermediate signal and the second intermediate signal in response to a transition of the input signal, and
wherein one of the first and second intermediate signals is delayed with respect to the other based on the direction of the transition of the input signal.

17. The apparatus of claim 14, wherein the delay introduced by the tracking circuitry is such that only one of the PMOS driver and NMOS driver is enabled at any time.

18. A method to convert an input signal from a source voltage domain to an output signal for a destination voltage domain, the method comprising:
generating, at an output node, the output signal for the destination voltage domain in dependence on the input signal, wherein the destination voltage domain operates from a supply voltage that exceeds a stressing threshold of components within a level shifting circuitry;
performing a tracking process to ensure that a voltage drop across the components within the level shifting circuitry is less than or equal to the stressing threshold, wherein
the components within the level shifting circuitry are part of a first gate tracking circuit of a first type and a second gate tracking circuit of a second type that is different than the first type,
the components of the first gate tracking circuit include first transistors of the first type arranged in series between the input signal and the second gate tracking circuit, wherein the first transistors of the first type include a pair of first transistors that form a first transistor stack with at least one other first transistor,
the components of the second gate tracking circuit include second transistors of the second type arranged in series between the supply voltage and the first gate tracking circuit, wherein the second transistors of the second type include a pair of second transistors that form a second transistor stack with at least one other second transistor, and
the tracking process additionally introduces a delay in a change in the output signal in response to a change in the input signal; and
controlling a voltage on the output node to compensate for the delay introduced by the tracking process.

19. An apparatus to convert an input signal from a source voltage domain to an output signal for a destination voltage domain, the apparatus comprising:

means for generating, at an output node, the output signal for the destination voltage domain in dependence on the input signal, wherein the means for generating operates from a supply voltage, and wherein the destination voltage domain operates from the supply voltage that exceeds a stressing threshold;

means for tracking associated with the means for generating, wherein the means for tracking includes a first gate tracker of a first type and a second gate tracker of a second type that is different than the first type, the first gate tracker having first transistors of the first type arranged in series between the input signal and the second gate tracker, wherein the first transistors of the first type include a pair of first transistors that form a first transistor stack with at least one other first transistor, the second gate tracker having second transistors of the second type arranged in series between the supply voltage and the first gate tracker, wherein the second transistors of the second type include a pair of second transistors that form a second transistor stack with at least one other second transistor, wherein the means or tracking ensures that a voltage drop across the first and second transistors is less than or equal to the stressing threshold, and wherein the means for tracking additionally introduces a delay in a change in the output signal in response to a change in the input signal; and means for timing compensation to control a voltage on the output node to compensate for the delay introduced by the means for tracking.

20. The apparatus of claim 1, wherein the first type is an N-type, and the second type is a P-type.

* * * * *